(12) United States Patent
Carr (10) Patent No.: US 9,236,552 B2
(45) Date of Patent: *Jan. 12, 2016

(54) THERMOELECTRIC MICRO-PLATFORM FOR COOLING AND TEMPERATURE SENSING

(71) Applicant: William N. Carr, Montclair, NJ (US)

(72) Inventor: William N. Carr, Montclair, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 14/676,867

(22) Filed: Apr. 2, 2015

(65) Prior Publication Data

US 2015/0207052 A1   Jul. 23, 2015

Related U.S. Application Data

(63) Continuation-in-part of application No. 14/245,598, filed on Apr. 4, 2014, now Pat. No. 9,006,857.

(60) Provisional application No. 61/808,461, filed on Apr. 4, 2013, provisional application No. 61/948,877, filed on Mar. 6, 2014.

(51) Int. Cl.
| | |
|---|---|
| *H01L 35/10* | (2006.01) |
| *H01L 35/32* | (2006.01) |
| *G01L 27/00* | (2006.01) |
| *G01J 5/14* | (2006.01) |
| *H01L 27/146* | (2006.01) |
| *H01L 27/16* | (2006.01) |
| *G01J 5/12* | (2006.01) |

(52) U.S. Cl.
CPC . *H01L 35/10* (2013.01); *G01J 5/14* (2013.01); *G01L 27/005* (2013.01); *H01L 27/14601* (2013.01); *H01L 27/16* (2013.01); *H01L 35/32* (2013.01); *G01J 2005/123* (2013.01)

(58) Field of Classification Search
CPC   G01J 5/14; G01J 2005/123; H01L 27/14601; H01L 27/16; H01L 35/10; H01L 35/32; G01L 27/005
USPC ............ 374/130; 257/4, 12, 14, 40, 204, 209, 257/288, 292, 469, 470, 712, 735, 741; 438/22, 54, 99, 129, 141, 455, 478
See application file for complete search history.

(56) References Cited

U.S. PATENT DOCUMENTS

| | | |
|---|---|---|
| 6,339,187 B1 | 1/2002 | Inoue |
| 2003/0148620 A1 | 8/2003 | Chavan et al. |
| 2005/0012935 A1 | 1/2005 | Kersey |
| 2005/0109940 A1 | 5/2005 | Carr |
| 2005/0111008 A1 | 5/2005 | Murata |
| 2006/0066876 A1 | 3/2006 | Kothari |
| 2008/0062426 A1 | 3/2008 | Yoshida |
| 2008/0186504 A1 | 8/2008 | Kiesel et al. |
| 2008/0252442 A1 | 10/2008 | Mohamadi |
| 2011/0261370 A1 | 10/2011 | Floyd et al. |
| 2012/0162664 A1 | 6/2012 | Bakke et al. |
| 2012/0269228 A1 | 10/2012 | Nakamura et al. |

OTHER PUBLICATIONS

"Related U.S. Appl. No. 14/513,663", "NonFinal Office Action", Jun. 22, 2015, Publisher: USPTO, Published in: US.

*Primary Examiner* — Kyoung Lee
*Assistant Examiner* — Ratisha Mehta
(74) *Attorney, Agent, or Firm* — Kaplan Breyer Schwarz & Ottesen, LLP (57) ABSTRACT

A thermoelectric micro-platform includes a suspended micro-platform, the suspended micro-platform being configured as a support layer with a device layer disposed thereon. Two arrays of series-connected thermoelectric devices are disposed partially on the micro-platform. One array is operated as Peltier coolers and the other array is operated as Seebeck sensors.

20 Claims, 12 Drawing Sheets

THERMOELECTRIC MICRO-PLATFORM FOR COOLING AND TEMPERATURE SENSING

STATEMENT OF RELATED CASES

This case is a continuation-in-part of U.S. patent application Ser. No. 14/245,598, filed Apr. 4, 2014, which claims the benefit of Provisional Patent Application 61/808,461 filed Apr. 4, 2013 and 61/948,877 filed on Mar. 6, 2014, all of which cases are incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

FIELD OF THE INVENTION

The present invention pertains to a cooling and temperature sensing of small regions.

BACKGROUND OF THE INVENTION

Many sensor applications require sophisticated thermal packages for providing heat dissipation and/or temperature control. This is due to the nature of current processors and/or sensor-specific considerations.

Historically, circuit-level, device-level, and system-level techniques have been employed to manage heat dissipation. Cooling techniques can be broadly classified as "passive" or "active" based on power consumption. For passive techniques, power consumption is zero and relies on conduction (heat sink) and/or natural convection. For active techniques, some type of external power is required. A variety of active cooling techniques are available; choice is typically dependent on the application. Active cooling techniques include fans/heat pipe (hybrid), thermoelectric, liquid cooling, direct immersion, refrigeration, and cryogenics.

SUMMARY OF THE INVENTION

The present invention provides a thermoelectric micro-platform having cooling and temperature-sensing capabilities. In some embodiments, the thermoelectric micro-platform includes:
- a micro-platform (i.e., a platform having micron-sized dimensions);
- a plurality of thermoelectric structures having two junctions, wherein a first portion of the thermoelectric structures are operated in a Seebeck thermovoltaic mode for temperature sensing and a second portion of the thermoelectric structures are operated in a Peltier cooling mode for cooling;
- a semiconductor device, such as, without limitation, an electronic device, and opto-electronic device, etc.

In some embodiments, the thermoelectric micro-platform can be used to cool an integrated circuit or other small-size, heat-generating electronics device. In some other embodiments, the thermoelectric micro-platform is adapted, by the addition of a photo source and a photo sensor, to function as a hygrometer. In yet some further embodiments, the thermoelectric micro-platform is adapted, by the addition of micro-heaters, to function as a gas flow meter.

The micro-platform (of the thermoelectric micro-platform) comprises a support layer and a device layer, wherein the device layer is disposed on a portion of the support layer.

In the illustrative embodiment, the micro-platform is formed as follows. A micro-machinable material having, in some embodiments, a surface film of low thermal conductivity and low electrical conductivity cavity is prepared. In some embodiments, the material is prepared by oxidizing a silicon wafer. One or more cavities are then formed in one or more regions of the oxidized silicon wafer, leaving only the surface film above each cavity. Each such cavity thereby defines one overlying micro-platform, or, more precisely, the support layer thereof. Among any other purposes, this arrangement substantially thermally isolates the one or more micro-platforms from the surrounding ("off-platform") regions. The support layer, which in the illustrative embodiment is silicon dioxide, has a thickness that is typically in the range of about 0.1 to 5 microns. In other embodiments a bonded silicon-on-insulator SOI wafer is used as the starting wafer.

In the illustrative embodiment, the device layer, which is disposed on the support layer, comprises a material having high thermal conductivity and high electrical conductivity. In some embodiments, the device layer comprises single crystal silicon. In some embodiments, the device layer is a collection of closely spaced discrete structures that are formed from/in the device layer and are disposed on the support layer (as opposed to being a layer of material residing on the support layer and on which devices are disposed). In some embodiments, integrated structures having low thermal capacity are disposed on and in thermal contact with the device layer to take advantage of Peltier cooling from the device layer.

The thermoelectric structures are formed such that one junction thereof is positioned on the micro-platform (typically the device layer) and the other junction is positioned off-platform. The junction that is located off-platform provides a reference temperature as well as a means for electrical connection to off-platform circuits.

The thermoelectric devices provide several functions in conjunction with the illustrative embodiment of the invention. As already mentioned, some of the thermoelectric devices are operated as a sensor in a Seebeck thermovoltaic mode. In this mode, the thermoelectric devices will generate a voltage responsive to the temperature of one junction that is disposed on the device layer of micro-platform.

Other of the thermoelectric devices are operated as Peltier coolers to cool the micro-platform. To do this, an electric current is passed in the appropriate direction through the junction causing both types of charge carriers to move away from the junction and convey heat away, thus cooling the junction. This feature can be used, for example and without limitation, to: (1) reduce the electrical thermal noise inherent in the output signal from the integrated circuit, (2) provide a means of temperature control for sensor structures including an infrared thermopile, and (3) provide a means of dynamic, real-time control of the micro-platform temperature with closed-loop circuit control for applications such as a hygrometer and a gas flow rate sensor.

Single thermoelectric devices, whether for cooling or sensing, will not provide an adequate response for embodiments of the invention. As a consequence, a plurality of series-connected thermoelectric devices are used in embodiments of the present invention. In the illustrative embodiment, one array of series-connected thermoelectric devices are used for sensing and another array is used for cooling.

In the illustrative embodiment, the thermoelectric devices are implemented via semiconductor materials, wherein the junction in or on the microplatform is formed between two different semiconducting materials, with or without a metallic ohmic link. In some embodiments, there is no ohmic metal interconnect between the doped semiconductor regions; rather, the interface of the two heavily doped regions provides a form of p-n junction.

An important aspect of many embodiments of the present invention is that although the support layer of the micro-platform has low thermal conductivity, it must behave as if it were isothermal, or nearly so, for accurate temperature sensing. In the illustrative embodiment, this is accomplished as follows:

The individual structures that form the device layer have high thermal conductivity and those structures are situated quite close to one another on the support layer; and the sampling interval, $\tau_s$, for readout or excitation of the structures on the micro-platform must be less than thermal time constant, $\tau_p$, of the platform:

$$\tau_p = c/\sigma \quad [1]$$

wherein: c is the thermal heat capacity of the platform; and

σ is the thermal conductance between the platform and substrate as required to maintain the isotherm over the platform.

The nano-wires (so-called because of their nano-scale dimensions) that electrically couple on-platform structures to off-platform structures, such as those that are part of the thermoelectric devices, present an interesting challenge. They must be electrically conductive yet, at the same time, they should exhibit low thermal conductivity to keep the amount of heat that they conduct on or off the platform to a practical minimum. This is difficult to achieve via materials selection; indeed, since they are fabricated from the device layer material, they typically comprise a material having both high electrical and thermal conductivity.

In accordance with some embodiments, the wires include a physical adaptation for reducing their ability to conduct heat. In the illustrative embodiment, the physical adaptation is a plurality of "scattering holes" to scatter phonons, thereby reducing thermal conductivity along the length of the wire. The spacing between the scattering holes on the wire is about the phonon scattering length and greater than the scattering length for majority electrical charge carriers (i.e., electrons or holes). In particular, in conjunction with embodiments of the IR sensor, the phonon scattering length (about 50 to 500 nanometers) is typically about 10× greater than the scattering length for electrical charge carriers (about 5 to 50 nanometers). The presence of these scattering holes results in an increase in the ratio of electrical conductivity to thermal conductivity of each wire.

To package the thermoelectric micro-platform, the processed wafer is diced, using techniques which do not damage the thin platform area, as known to those skilled in the art. For example, dicing can be performed using a $CO_2$ or laser scriber tool. The resulting die are next bonded to the lead frame of an appropriate header, followed by ultrasonic wire bonding. A cap for the header is bonded with an appropriate metal or epoxy film to provide, in some cases, a hermetic seal around the platform structure.

DETAILED DESCRIPTION

Definitions. The following terms as explicitly defined for use in this disclosure and the appended claims:

"micro-platform" means a platform having dimensions of about 100 nanometers on a side up to about 1 centimeter on a side and including one junction of at least one thermoelectric device.

"nano-dimensioned" or "nano-sized" or "nanometer-sized" means a structure whose largest dimension does not exceed 500 nanometers.

"nano-wire" means a portion of electrically conductive material having a thickness and width each with a maximum size of no more than about 500 nanometers and an arbitrarily long length. The lower "limit" on thickness and width is primarily a function of technology. Using, for example, nanotubes, the thickness and width (or diameter) could be about 10 nanometers or even smaller.

"thermocouple" means a thermoelectric device, used to measure temperature, consisting of two dissimilar metals or semiconductors. In some versions, the two conductors are joined at one end, creating a first junction. The first junction is where temperature is measured. When the first junction experiences a change in temperature, a voltage is presented across the other end of the two conductors at a second junction. When the two different junctions are exposed to a temperature gradient, they generate an electrical voltage known as the Seebeck voltage.

"thermoelectric effect" means the direct conversion of a temperature difference to a voltage and vice-versa. This term encompasses three separate effects: the Seebeck effect, the Peltier effect, and the Thomson effect. The Seebeck effect is the conversion of temperature differences directly into electricity. The Peltier effect is the presence of heating or cooling at an electrified junction of two dissimilar conductors. The Seebeck and Peltier effects are thermodynamically reversible phenomena.

Figure 1:
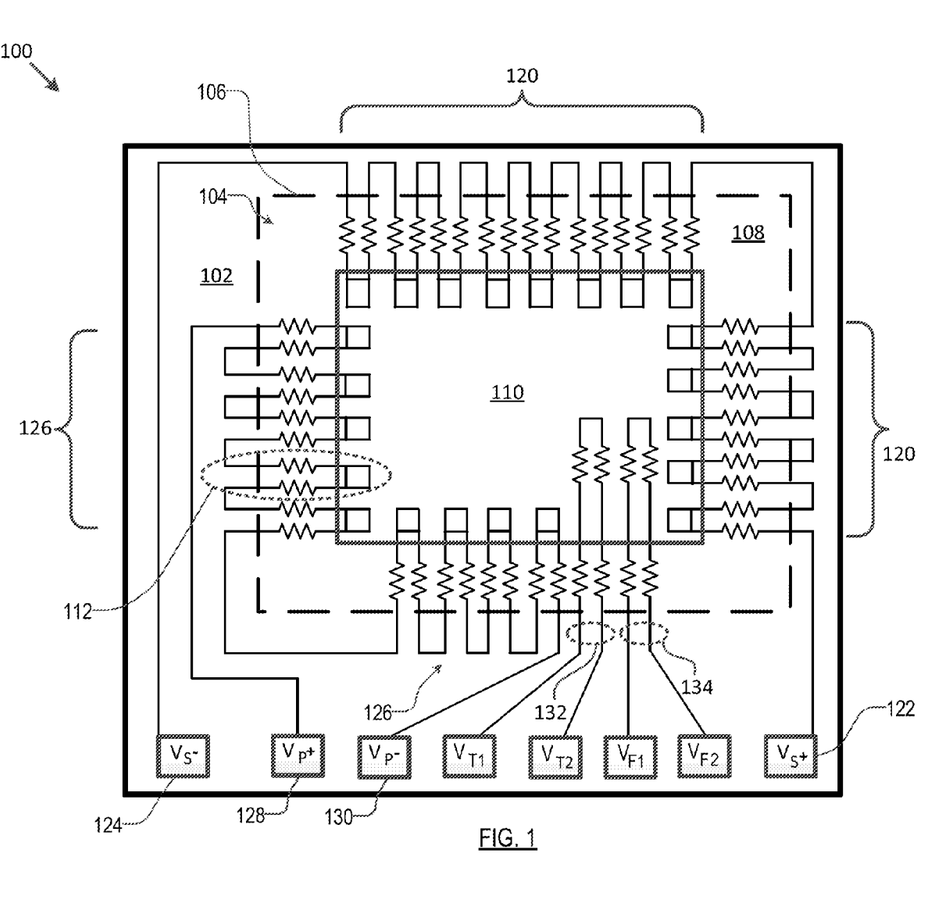
FIG. 1 depicts a plan view of a thermoelectric micro-platform with cooling and sensing capabilities in accordance with the illustrative embodiment of the present invention.
Figure 3:
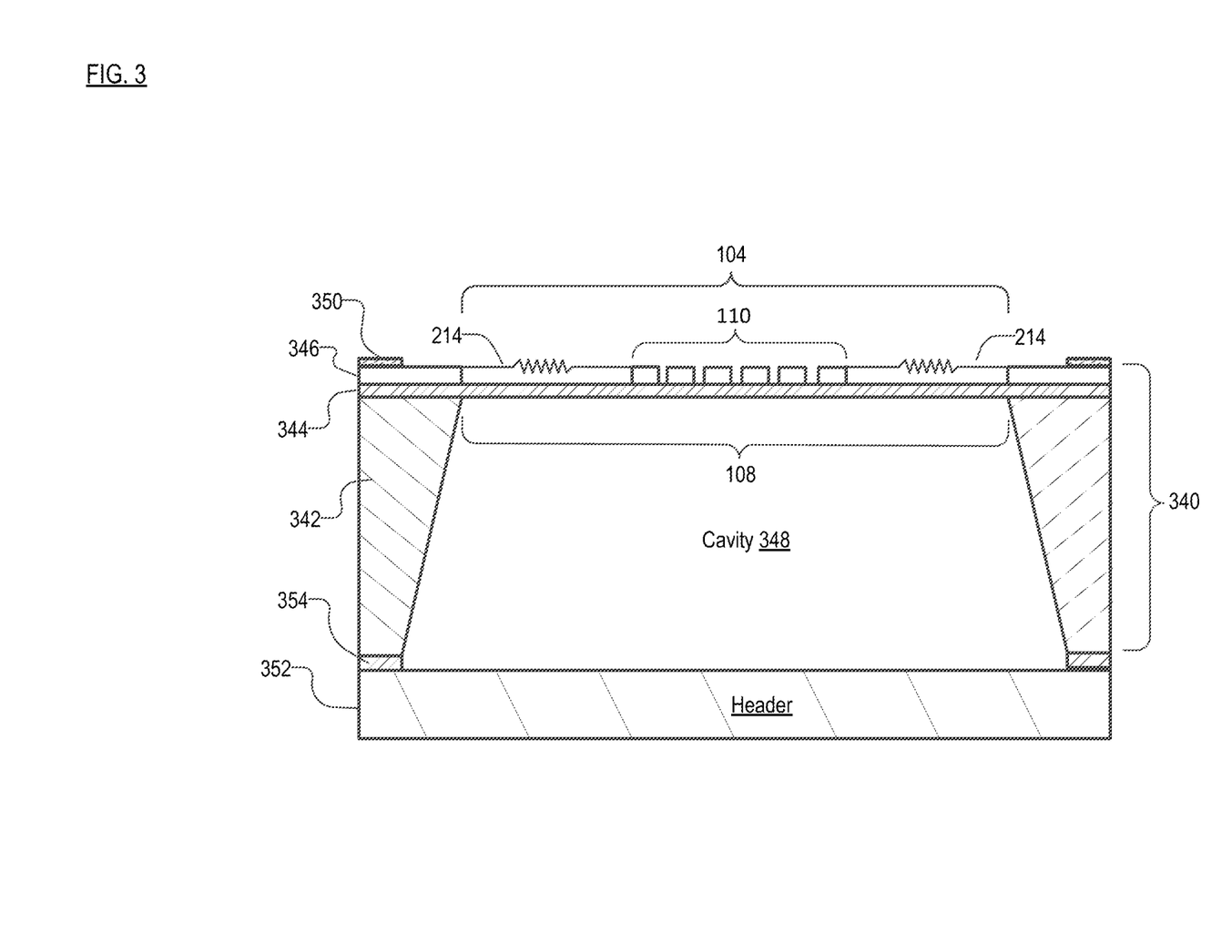
FIG. 3 depicts a simplified side cross-sectional view of FIG. 1.

FIGS. 1 and 3 depict respective plan and cross-sectional views of thermoelectric micro-platform 100 in accordance with the illustrative embodiment of the present invention. Thermoelectric micro-platform 100 comprises off-platform region 102, micro-platform 104, thermoelectric devices 112, resistor 132 and piezo transducer 134.

Referring to both FIGS. 1 and 3, micro-platform 104 comprises suspended support layer 108 and device layer 110. Support layer 108 is a suspended portion of layer 344, created by forming cavity 348 in bulk material 342. Perimeter 106 of cavity 348 defines the extent of support layer 108. Support layer 108, and layer 344 from which it is defined, comprise a material having relatively low thermal conductivity (k<0.2 W/(m·K)) and low electrical conductivity (σ<0.001 Siemens/m). Materials suitable for use as support layer 108 include, without limitation, many oxides (e.g., silicon dioxide [$SiO_2$], titanium dioxide [$TiO_2$], etc.), and silicon nitride [$Si_3N_4$]. Bulk material 342 can be, for example, silicon, gallium arsenide, germanium, or other micro-machinable materials.

Off-platform region 102 is any region outside perimeter 106 of cavity 348. One junction of each thermoelectric device 112 is disposed on off-platform region 102. Because the off-platform region is substantially thermally isolated from micro-platform 110, the one junction of each thermoelectric device 112 disposed thereon can be maintained at a reference temperature. Additionally, electrical contact pads (e.g., contacts 122, 124, 128, 130, etc.) and portions of other optional devices (e.g., resistor 132 and piezo transducer 134, etc.) are disposed on off-platform region 102. The resistor 132 is illustrative of circuit connections and structures in embodiments including, but not limited to, thermistor resistors in the device layer and nano-wire electrical connections to integrated circuits in and on the device layer.

Device layer 110 is disposed on support layer 108. In some embodiments, device layer 110 comprises a material having high thermal conductivity and high electrical conductivity, including, without limitation, single crystal silicon, germanium, silicon-germanium, bismuth-telluride, graphine, and carbon nanotubes. Thermoelectric devices 112 are patterned from, in, or on device layer 110.

As depicted in FIG. 3, substrate 342 is coupled to header 352. For clarity, a single micro-platform 104 is depicted; typically, more than one such platform is coupled to a header.

Figure 4:
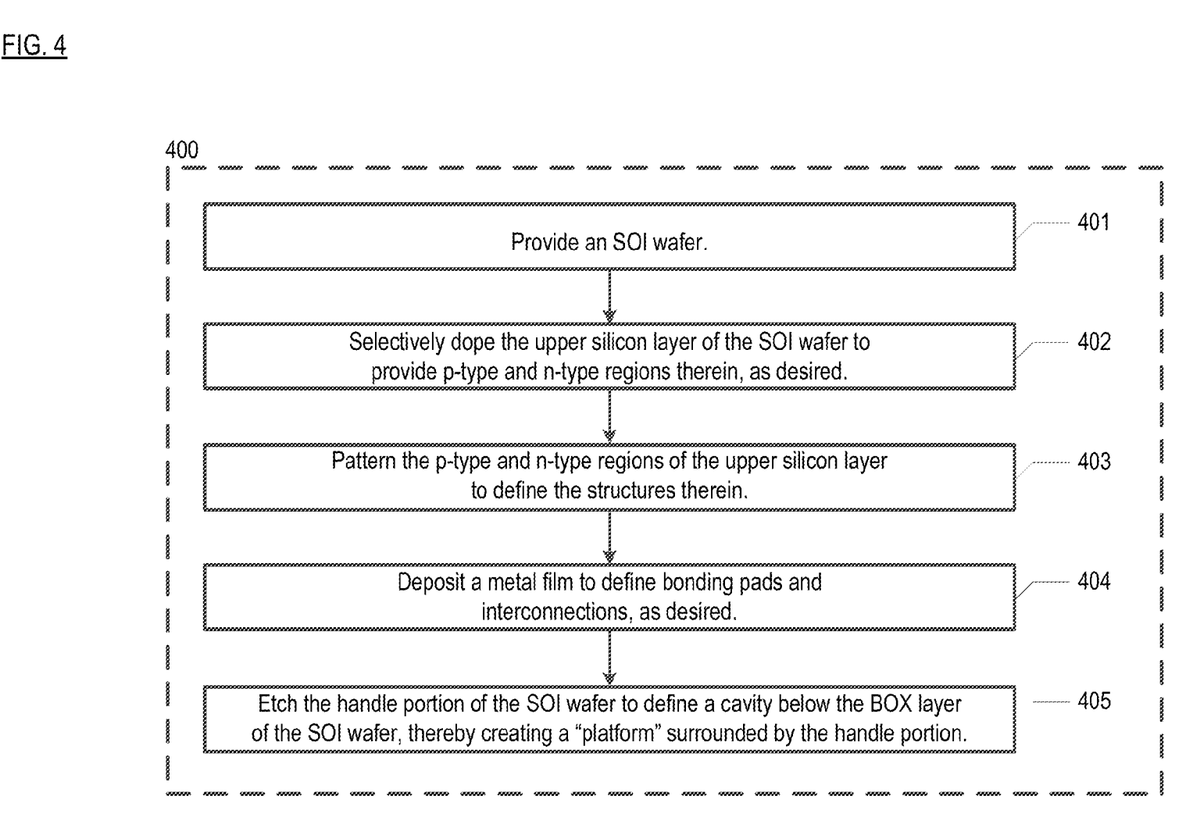
FIG. 4 depicts a method for fabricating the platform of FIG. 1 in accordance with an embodiment of the invention.

FIG. 4 depicts method 400 for forming micro-platform 104 of FIG. 1 in accordance with an illustrative embodiment of the invention. According to the method, a silicon-on-insulator ("SOI") wafer is provided at operation 401. Well known to those skilled in the art, an SOI wafer comprises three layers: (i) an uppermost layer of single crystal silicon, which is suitable for use as a device layer, (ii) a lowermost substrate or "handle" layer of single crystal silicon, and (iii) a layer of silicon dioxide sandwiched between the aforementioned layers. This buried oxide or "BOX layer forms the support layer for the platform. With reference to FIG. 3, the uppermost layer corresponds to layer 346 and device layer 110, the handle layer corresponds to layer 342, and the BOX layer corresponds to layer 344 and support layer 108. More generally, processing begins with a starting wafer of micro-machinable material, with a surface film of low thermal conductivity and low electrical conductivity, such as an oxidized silicon wafer.

If the starting wafer is other than SOI, such as an oxidized silicon wafer, then a layer of semiconductor is deposited on the oxide layer. The semiconductor layer serves as a device layer (i.e., layer 110). That layer will eventually be processed to create thermoelectric couples as well as other structures on the platform, depending on application specifics. For the creation of silicon-based structures on the platform, processing of the top surface can be performed in a semiconductor foundry cleanroom using processing generally compatible with production of silicon integrated circuits including CMOS If the starting wafer is an SOI wafer, depositing a layer of semiconductor is not required, since the upper surface of an SOI wafer is a semiconductor layer. In this case, processing continues at operation 402, wherein the upper layer of the SOI wafer is selectively doped to provide p-type and n-type regions therein, as required to support the intended design (i.e., the creation of on-platform structures and nanowires).

If the device layer in the starting wafer is already doped to a desired p- or n-doping level, then a compensating donor or acceptor impurity is used to achieve the desired impurity polarities and densities for the thermoelectric devices and other structures. Those skilled in the art are familiar with such doping operations, including appropriate dopant atoms, doping levels, and methods for doping.

In operation 403, the doped device layer is selectively patterned to define the desired structures, using, for example, standard lithographic patterning techniques. An extreme ultraviolet stepper, for example, can be used to define any nano-dimensioned structures, such as nano-wires 214.

In operation 404, a metal film (e.g., aluminum, etc.) is deposited, followed by conventional metal lift-off processing to define bond pads (i.e., pads 350) and interconnections on the "off-platform" portion 102. In embodiments in which an integrated circuit is created in or positioned on device region 110, appropriate interconnections are created as illustrated by nano-wire connections 132.

In operation 405, a back-side etch is performed to create cavity 348 beneath the region designated to be micro-platform 104. The etch proceeds through substrate layer 342 to an etch stop at layer 344, which is what will become support layer 108 of the micro-platform. In the case of an SOI starting wafer, the etch proceeds through the substrate to the silicon dioxide layer. This effectively "releases" micro-platform 104 and thermally isolates device region 110 from the surrounding material.

The back-side etch can be performed via deep-reactive ion etching ("DRIE"), configured, for example, to achieve near vertical sidewalls of the cavity (e.g., via the Bosch process, etc.). Alternatively, the backside etch can be performed using wet chemical etchants, such as, without limitation, TMAH, hydrazine, xenon hexafluoride, or potassium hydroxide.

Operations 401 through 405 produce the micro-platform, on-platform structures, and off-platform structures.

Figure 2:
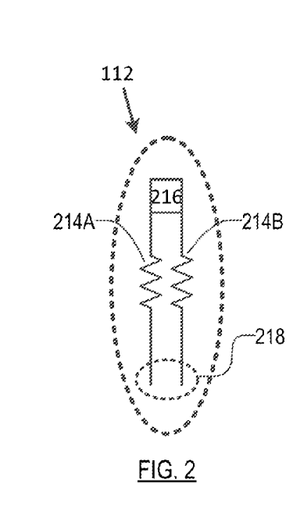
FIG. 2 depicts a thermoelectric device used in the thermoelectric micro-platform of FIG. 1.

Referring now to FIG. 2, each thermoelectric device 112 includes two junctions: junction 216 is disposed on micro-platform 104 (in/on device layer 110) and junction 218 is disposed in/on off-platform region 102. The two junctions are joined by nano-wires 214A and 214B.

Junction 216 of thermoelectric devices 112 can be formed in device layer 110 via techniques known in the art, such as, for example, masked diffusion doping one species of impurity (n or p) into a corresponding (p-type or n-type) impurity or via separate masked diffusions of n and p impurities. In some embodiments with silicon, the p-type impurity is boron and the n-type impurity is phosphorous, although other species of dopant may suitably be used. The thermoelectric devices 112 are heavily doped at degenerate levels in order to (a) reduce the series resistance of the nano-wire "legs" of the thermoelectric devices within the temperature gradient and (b) reduce the temperature coefficient of the Seebeck coefficient and source resistance to a minimum.

Nano-wires 214A and 214B (collectively "214"), which connect junctions 216 and 218, are suspended over support layer 108 and can be formed, for example, by patterning layer 346 (e.g., single-crystal silicon) or separately deposited and patterned from non-silicon material of high electrical conductivity, such as, without limitation, germanium, silicon-germanium, bismuth-telluride, graphine, PZT and alloys thereof, and carbon nanotubes.

Electrical connections external to micro-platform 104 are patterned metal interconnects, typically aluminum. Thus, nano-wires 214 couples to such metal interconnects in off-platform region 102 beyond perimeter 106 (see FIG. 1).

Referring again to FIG. 1, thermoelectric devices 112 are organized into two arrays: array 120 of "sensing" (Seebeck mode) thermoelectric devices and array 126 of "cooling" (Peltier mode) thermoelectric devices. In the embodiment depicted in FIG. 1, the cooling devices (linear array 126) and the sensing devices (linear array 120) are implemented as distinct structures. In some other embodiments, a single linear array can be utilized for both cooling and sensing. This is accomplished by switching connections to external voltage sources and signal-conditioning preamp circuits.

Figure 5:
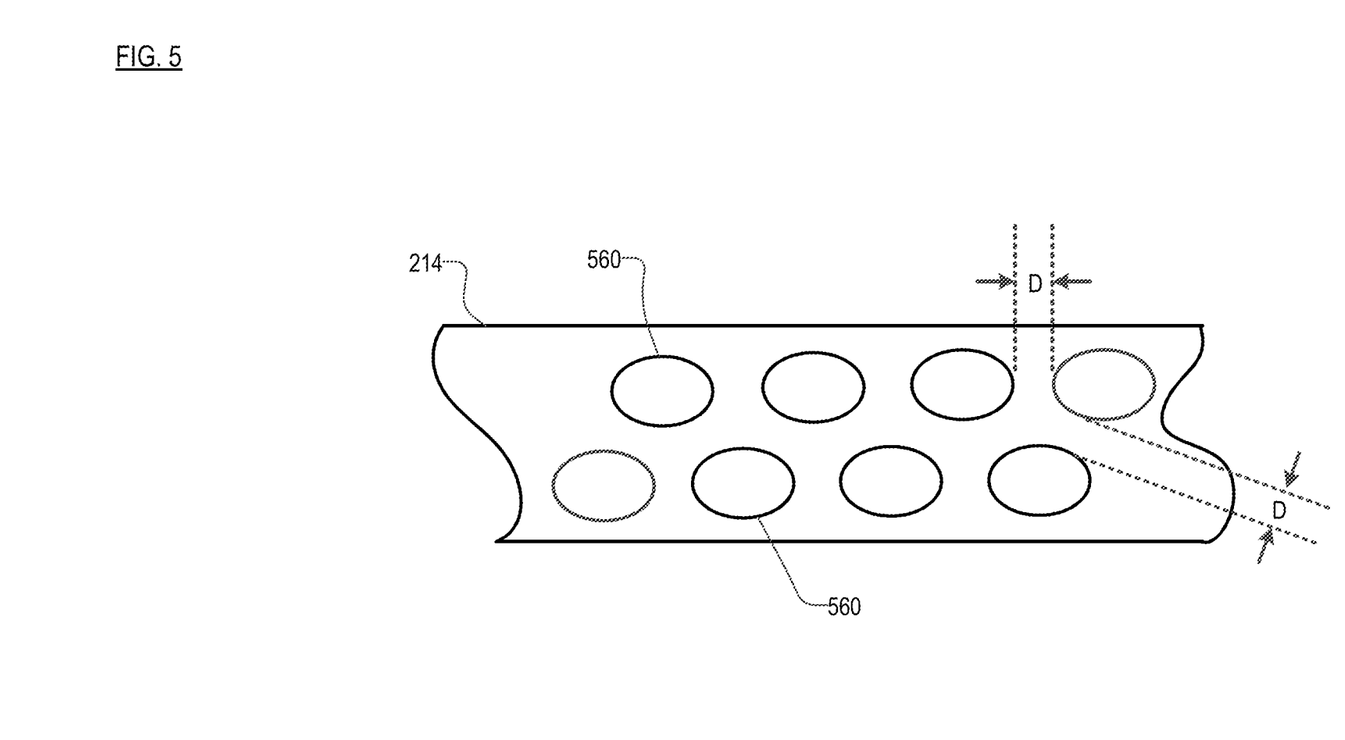
FIG. 5 depicts a nano-wire for providing electrical connection between on-platform structures and off-platform structures.

FIG. 5 depicts a portion of nanowire 214. Although nanowires 214 are formed from a material with relatively high thermal conductivity, it is important to minimize, to the extent possible, the amount of heat conducted to or away from micro-platform 104 via the nano-wires. The thermal conductivity of nano-wire 214 is a function of its dimensions, the thermal conductivity of the material of which the nano-wire is made, and the phonon scattering coefficient within the beams. The phonon scattering-efficiency coefficient is dependent on the phonon scattering from the silicon lattice and boundaries. The greater the scattering, the lower the thermal conductivity. This scattering is enhanced by including physical "holes"—phonon scattering holes—in the nano-wires. As a consequence, the presence of phonon scattering holes 560 reduces thermal conductivity along the length of nano-wire 214. The spacing, D, between the scattering holes is about equal to the phonon scattering length (about 50 to 500 nanometers). The diameter of the holes is less than about 300 nanometers. The presence of these scattering holes results in an increase in the ratio of electrical conductivity to thermal conductivity of each nano-wire.

In addition to arrays 120 and 126 of thermocouples 112, the illustrative embodiment (but not all embodiments) of thermoelectric micro-platform 100 includes resistor 132 and piezo transducer 134 (see FIG. 1). These elements provide several functions, as explained below.

In some embodiments, thermoelectric micro-platform 100 is sealed via a header and maintained under vacuum or under pressure using a low-thermal conductivity gas such as xenon, argon, krypton, etc. One reason for this is to limit the thermal paths for cooling of nanowires 214 of the thermocouples. It is therefore important to maintain vacuum or elevated pressure, and, as described further below, one function of resistor 132 and piezo-transducer 134 is to detect hermetic seal failures or incremental gas leaks.

Also, to monitor the absolute temperature of device layer 110, and to provide a signal for closed-loop control of temperature in the device layer, resistor 132 (of a thermistor type) is used.

Furthermore, accurate pressure measurement via the piezo-transducer requires a correction for absolute temperature. Resistor 132 provides that functionality as well.

Figure 6:
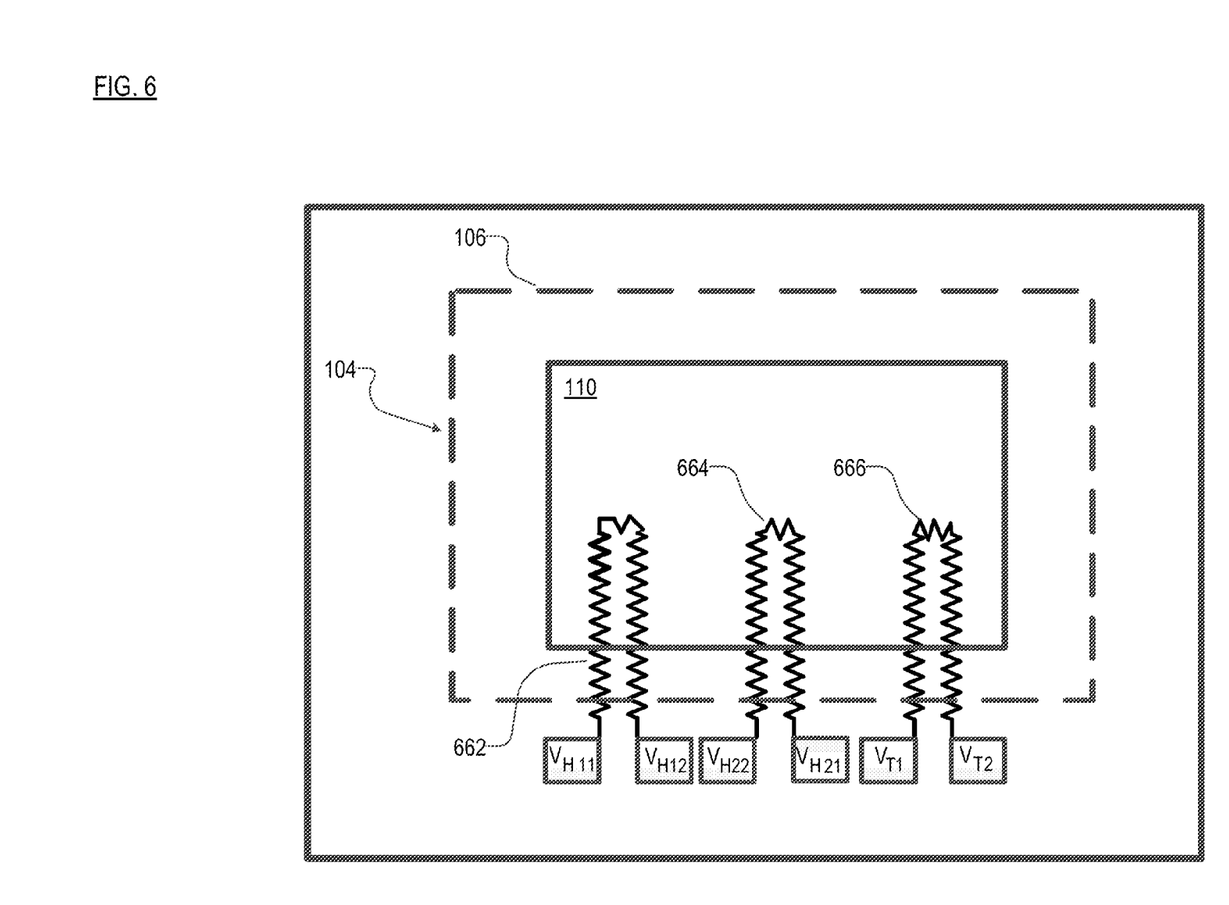
FIG. 6 depicts a barometric pressure sensor in accordance with the present teachings.

FIG. 6 depicts elements that can be used for pressure sensing/monitoring and temperature calibration thereof. These elements include ohmic heater 662, piezo-resistor 664, and thermistor 666. These elements are functionally equivalent to resistor 132 and piezo-transducer 134 depicted in FIG. 1. Specifically, piezo-resistor 664 and thermistor 666 are equivalent to resistor 132 and ohmic heater 662 is equivalent to piezo-transducer 134.

Micro-platform 104 will stress slightly up or down as a function of pressure conditions within hermetically sealed cavity volume 348. It will be appreciated that the self-resonant frequency of micro-platform is a function of that pressure. Heater 662 (or piezo-transducer 134) is driven by an external voltage pulse applied to the electrical contacts thereof. As a result of the pulsed heating of device layer 110 and the constant sink temperature of the surrounding structure 102, the micro-platform experiences a pulsed flexing. The flexing excites a mechanical oscillation mode of the micro-platform, thereby causing the platform to oscillate. In the embodiment depicted in FIG. 6, piezo-resistor 664 is used to sense the stress with support platform 108 and provide a means of differential pressure sensing. It does so by modulating the resistance of piezoresistor 134 as a consequence of movement of the platform, wherein that change of resistance is used to calculate the frequency of movement. The mechanical resonance frequency of micro-platform 104 is a function of the density and species of gas to which the platform is exposed. In some embodiments, the cavity beneath platform 108 is hermetically sealed.

In the illustrative embodiment wherein device layer 110 is single crystal silicon, heater 662 (piezo-transducer 134) can also be used as a piezo-resistor to determine the resonant frequency. In some embodiments, the micro-platform is excited into a self-resonant mode by mechanical impulses from an integral piezoelectric actuator. The frequency of this oscillation is sensed by an integral piezo-resistive transducer. In embodiments in which single crystal silicon is used for device layer 110 and silicon dioxide is used for support layer 108, the piezo-resistor is defined within the device layer. Since silicon is not a good piezo-actuator, other materials such as patterned PZT is preferred to excite oscillations in device layer 110.

A look-up table (stored in processor-accessible memory) is used to determine the gas pressure based on the resonant frequency. Thermistor 666 (resistor 132) or other temperature-sensing structures are used to determine platform temperature or calibrate the pressure sensor function.

The wires composing resistor 132 and piezo-transducer 134, which are on or within micro-platform 104, can be, but are not necessarily, nanowires.

In summary, embodiments of thermoelectric micro-platform 100 in accordance with the present teachings include one or more of the following features:

- One or more cavities formed in a substrate, the cavities defining a corresponding number of micro-platforms. This arrangement serves, among any other functions, to thermally isolate each micro-platform from all off-platform regions.
- Each micro-platform includes one or more arrays of semiconductor thermoelectric devices operated in a Seebeck thermovoltaic mode, wherein the thermoelectric devices generate a voltage responsive to a temperature change.
- Each micro-platform includes one or more arrays of semiconductor thermoelectric devices that are arranged and operated as Peltier coolers with externally supplied power to cool the device layer.
- An array of Peltier coolers operated with reversed voltage polarity of the externally supplied power supply to provide a heating effect instead of cooling.
- Each array of thermoelectric devices is structurally programmed, via circuit interconnects, to provide a desired electrical resistance and thermoelectric response.

Each on-platform junction is connected via nanowires to another junction positioned off-platform.

A thermistor or other semiconductor device located either on the substrate or integral to the micro-platform for providing absolute temperature and provide closed-loop control of temperature.

The nano-wires of the thermoelectric devices comprise phonon scattering structures.

Thermoelectric devices and other elements on or in the device layer are closely-spaced to provide a substantially isothermal platform.

In some embodiments, there is no ohmic-metal interconnect between the doped semiconductor regions, and the couple is heavily doped on both sides providing a form of p-n junction.

Structures for exciting and monitoring resonance of the micro-platform, which is sensitive to the level of vacuum or pressure. The structure will thermally excite or piezo-excite and piezo-sense a self-resonant frequency of the micro-platform to determine gas pressure. In such embodiments, the cavity beneath the micro-platform is advantageously, but not necessarily, hermetically sealed.

In some embodiments, the header and micro-platform(s) are exposed to and hermetically sealed with a low-thermal conductivity gas such as, without limitation, air, argon, xenon, or krypton.

An ohmic resistive heater with externally supplied electric power.

The thermoelectric devices and nano-wires are formed from one or more of the following non-exclusive list of materials, including Si, Ge, SiGe, BiTe, graphine, PZT and various types of carbon nanotubes.

The micro-platform comprises a support layer having low thermal conductivity, wherein the support layer is selected from the following non-exclusive list of materials including $SiO_2$, $Si_3N_4$ and $TiO_2$.

A preamplifier circuit to amplify the signal from the thermoelectric devices that are operated as sensors.

Example 1

Cooling an Integrated Circuit

Figure 7:
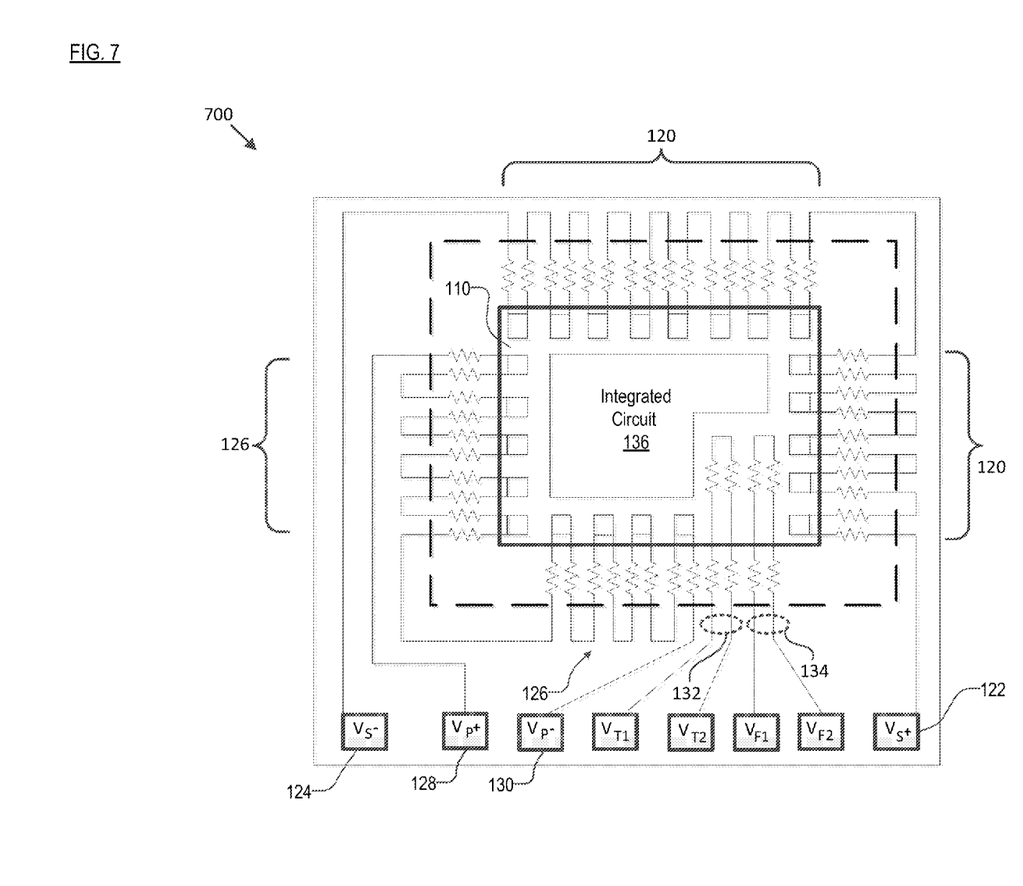
FIG. 7 depicts the thermoelectric micro-platform configured as integrated-circuit cooler.

FIG. 7 depicts thermoelectric micro-platform 700 in accordance with the present teachings. Thermoelectric micro-platform 700 comprises includes device layer 110 with integrated circuit 136 disposed thereon.

Array 120 of sensing thermoelectric devices generates a voltage responsive to the temperature difference that results between the on-platform and off-platform junctions thereof as a consequence of the heat generated by integrated circuit 136. The output from array 120 can thus be used for feedback temperature control to maintain device layer 110 at a specified temperature. In particular, the temperature information from array 120 can be used to control array 126 of cooling thermoelectric devices (i.e., control the power supplied to the array 126), which can be operated to cool device layer 110.

Keeping device layer 110 (and integrated circuit 136) cool reduces the electrical thermal noise inherent in the output signal from integrated circuit 136. This is especially important in the instance where integrated circuit 136 is a low noise amplifier LNA. In other instances, a controlled cooling of the micro-platform permits a precise temperature environment on device layer 110 for monitoring chemical, biological, physical reactions and effects. As an example, precise temperature control of device layer 110 permits slowing down chemical and bacterial/viral reactions with cooler temperature in order to determine temporal reaction and interaction rates. When the supply voltage polarity driving the Peltier array 126 is reversed, the array is heated, thus providing an extended range of temperature control for device layer 110.

Example 2

Humidity Sensor

Figure 8:
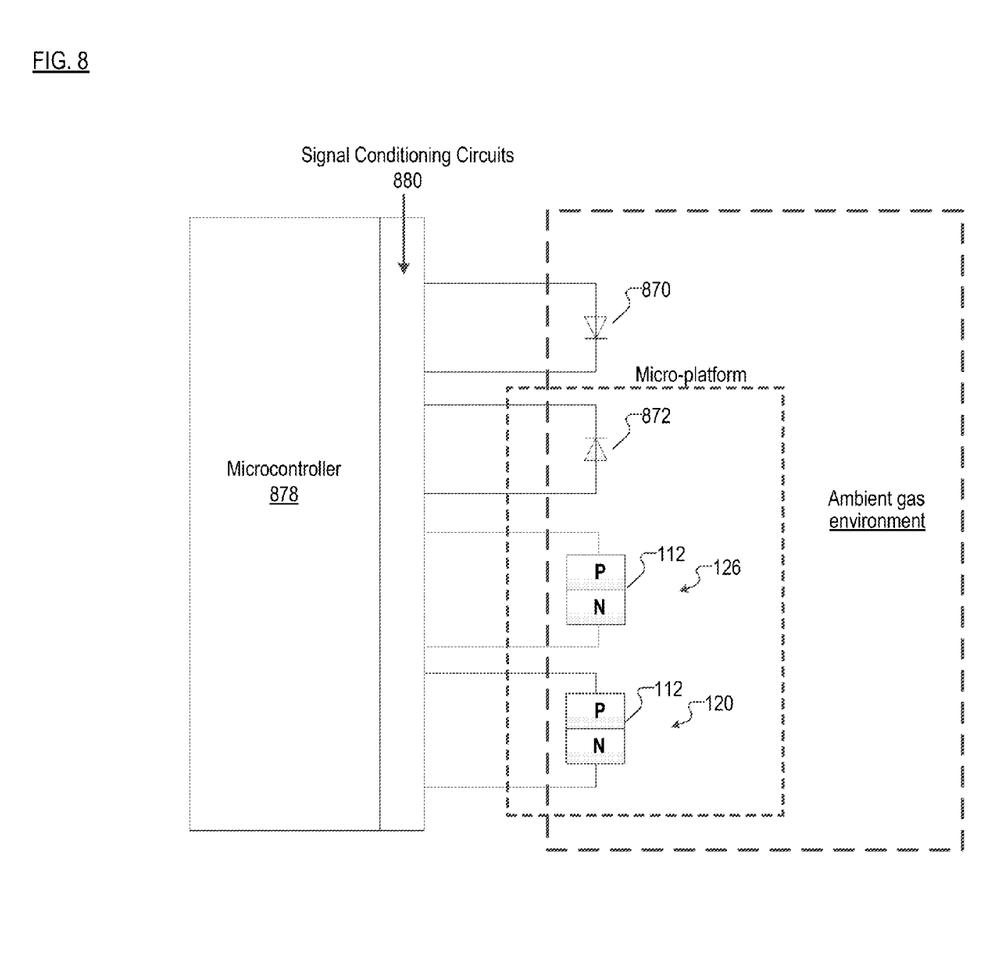
FIG. 8 depicts, functionally, a hygrometer in accordance with the present teachings.

A thermoelectric micro-platform in accordance with the present teachings can be adapted for use as a humidity sensor. Such a sensor is capable of directly sensing the absolute dew point temperature via optical reflection from a surface that is sensitive to a moisture film. In particular, when the micro-platform is cooled to the dew point temperature, a very thin film of condensation forms on its surface. The film of condensation alters the transmissivity/reflectivity of the photodiode surface and thus its response to light from photosource 870.

FIG. 8 depicts the functional components of hygrometer, as implemented via a thermoelectric micro-platform in accordance with an embodiment of the present invention. Photo source 870, typically a GaAs based near-infrared LED, is used as a source of light. In some other embodiments, the photo source is selected from among the following non-limiting group, including GaN, GaP, InGaN, and InGaAlP. It is used to illuminate an optical sensor 872, which in the illustrative embodiment is a p-n junction photodiode that is formed within the thermoelectric micro-platform. The response of optical sensor 872 to light incident thereon is modulated by any condensation of vapor on its surface, such as would occur when the temperature of the photodiode surface is cooled to the dew point temperature. The surface of the photodiode is cooled via array 126 of thermoelectric device (s) 112 operated as Peltier coolers.

The temperature of the photodiode is monitored by via array 120 of thermoelectric device(s) 112 operated as Seebeck sensors or via a thermistor, the latter providing a reading of the absolute temperature of the photodiode surface.

Preferably, the temperature of the thermoelectric micro-platform containing optical sensor 872 is gradually lowered gradually to the dew point temperature. The temperature is used, in conjunction with a lookup table, to determine the relative humidity of the ambient gas. Microcontroller 878 controls, for example, the operation of thermoelectric devices 112, photo source 870, etc., and signal conditioning circuitry 880 conditions (e.g., amplifies, filters, converts, range matching, isolation, etc.), as appropriate, the input to and output from photo source 870, optical sensor 872, and thermoelectric devices 112.

In some embodiments, after a determination of humidity, the micro-platform is heated to vaporize any condensed moisture and prepare for another cycle of humidity determination. The micro-platform is heated by, for example and without limitation, using a built-in resistor heater or by reverse biasing the Peltier coolers to provide a heater function.

Figure 9:
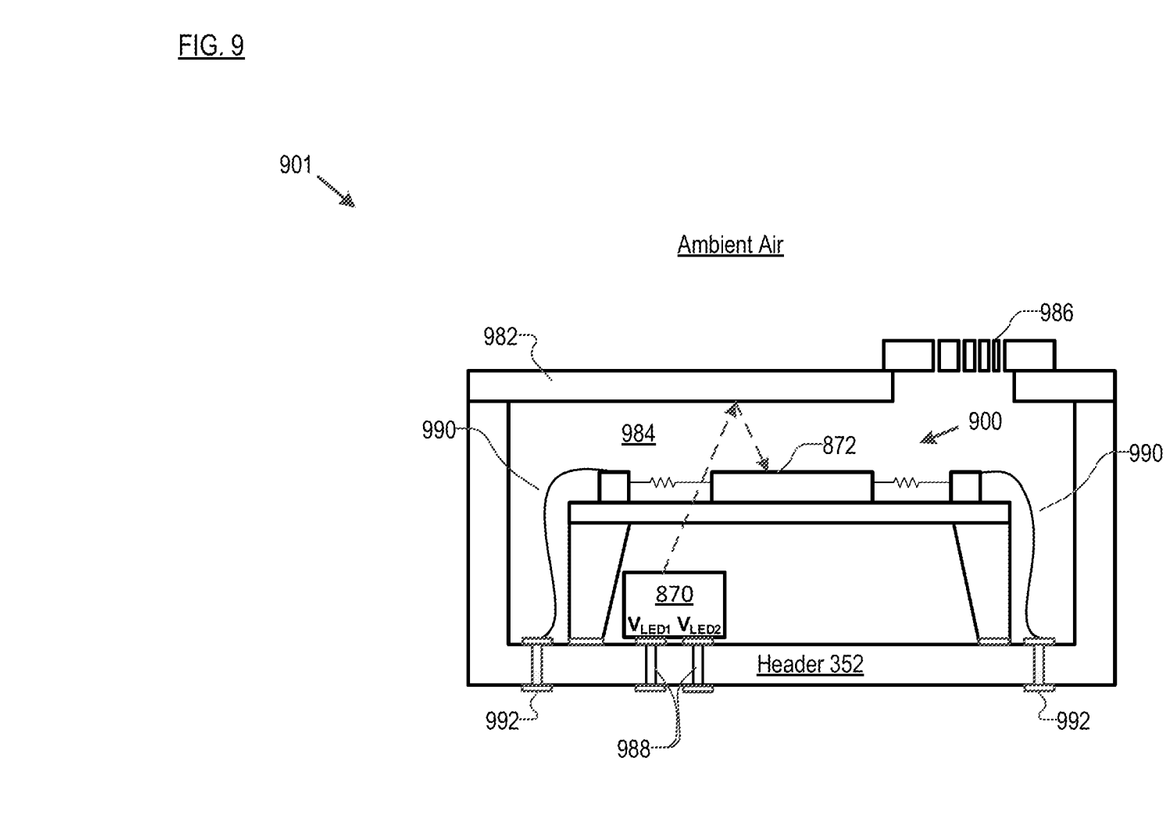
FIG. 9 depicts a first embodiment of a hygrometer incorporating a thermoelectric micro-platform in accordance with the present teachings.

FIG. 9 depicts, via a cross-sectional view, hygrometer 901 comprising thermoelectric micro-platform 900 in accordance with the present teachings. In addition to thermoelectric micro-platform 900, hygrometer 901 includes photo source 870, optical sensor 872, package frame 982 defining hygrometer chamber 984, and porous air filter 986. The air filter removes particulates from the air before it enters hygrometer chamber 984 and permits moisture in the ambient air to equilibrate with moisture inside the chamber.

In the illustrative embodiment, photo source 870 is disposed in the cavity beneath thermoelectric micro-platform 900. In this embodiment, photo source 870 is an LED emitting light in the near-infrared (i.e., 0.75 to 1.4 micron wavelength). As previously indicated, other types of photo sources and LEDs emitting light having a different range of wavelengths can suitably be used. Electrical contacts $V_{LED1}$ and $V_{LED2}$ of photo source 870 are accessed through header 352 using electrical feedthrough connections 988.

In the illustrative embodiment, optical sensor 872, which in this embodiment is implemented as a p-n photodiode, is integral to thermoelectric micro-platform 900. As previously discussed, light from photo source 870 (in this embodiment, near-IR LED) is directed to optical sensor 872 (in this embodiment, p-n photodiode) that is in/on the device layer of the micro-platform. The presence of condensation on the surface of the photodiode affects the amount of light it senses and, as a consequence, the amount of photocurrent generated thereby.

An important aspect of this embodiment is that the p-n junction of the photodiode is created near the upper surface of the micro-platform. It is well known that contaminants such as a film of condensate can modulate the transmission of light through the surface of a photodiode and thus change the photodiode response. Also, surface condensates can increase the recombination of minority charge carriers near the surface and thus reduce the quantum efficiency of the photodiode. In this embodiment, the p-n junction of the photodiode is formed in a semiconductor film providing a charge depletion region near the surface and thus is highly sensitive to any surface water condensate such as occurs at the dewpoint temperature. This phenomenon is utilized in that an immediate reduction in photodiode current occurs when the micro-platform temperature is ramped down through the dew point temperature.

In some alternative embodiments, the photodiode may be a separate device that is mounted on thermoelectric micro-platform 900.

Electrical connection with photodiode 872 is obtained via wire interconnects 990 and electrical feedthrough connections 992.

Figure 10:
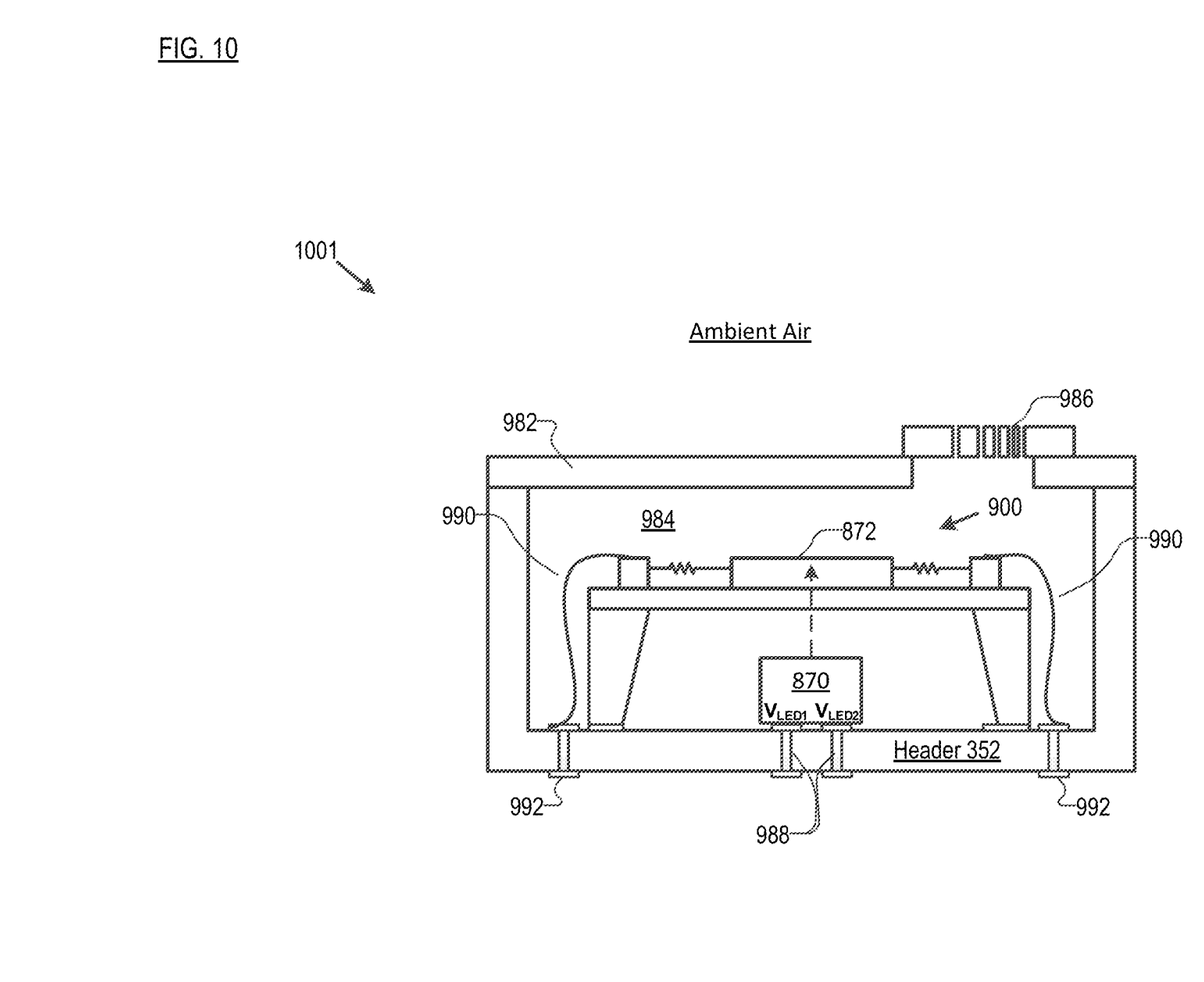
FIG. 10 depicts a second embodiment of a hygrometer incorporating a thermoelectric micro-platform in accordance with the present teachings.

FIG. 10 depicts, via a cross-sectional view, hygrometer 1001 comprising thermoelectric micro-platform 900 in accordance with the present teachings. Like hygrometer 901, hygrometer 1001 includes, in addition to thermoelectric micro-platform 900, photo source 870, optical sensor 872, package frame 982 defining hygrometer chamber 984, and porous air filter 986. This second embodiment differs from hygrometer 901 in that the photon source beam is transmitted directly into the semiconductor junction without an intermediate surface reflection. In this embodiment, undesirable stray light reflecting around in the header cavity is reduced. However, overall photodiode response is reduced due to absorption of the LED beam into regions that may not be particularly sensitive to surface fogging.

Figure 11:
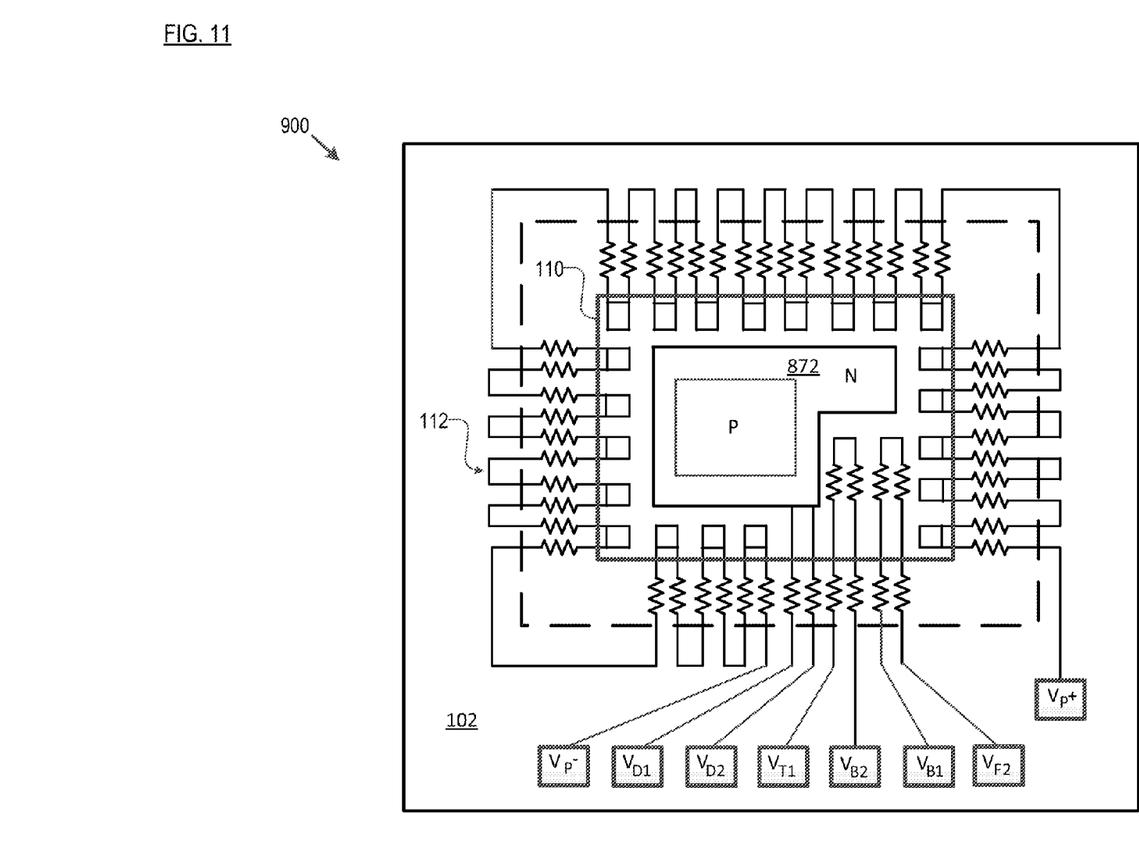
FIG. 11 depicts a plan view of a thermoelectric micro-platform for use in conjunction with the hygrometers of FIGS. 9 and 10.

FIG. 11 depicts a plan view of thermoelectric micro-platform 900. The p-n junction of photodiode 872 is shown in the interior portion of device layer 110 of the micro-platform. Thermoelectric devices 112, which are arrayed around the periphery of thermoelectric micro-platform 900, are operated as Peltier coolers (Vp+ and Vp−). The photodiode has bonding pads ($V_{D1}$ and $V_{D2}$) on substrate or off-platform region 102. In this embodiment, a piezo-resistive stress sensor accessed through contact pads $V_{T1}$ and $V_{B1}$ is integrated into device layer 110 and used to sense barometric pressure ($V_{B1}$ and $V_{B2}$) using a hermetically-sealed cavity.

Embodiments of a hygrometer in accordance with the present teachings include one or more of the following features:
  One or more cavities formed in the substrate defining a corresponding number of micro-platforms. This arrangement also serves to thermally isolate each micro-platform from the surrounding substrate.
  The array of thermoelectric devices is structurally programmed via circuit interconnects to provide a desired electrical resistance and thermoelectric response.
  The nanowires of the thermoelectric devices comprise phonon scattering structures.
  Electrically isolated thermoelectric devices operated as coolers and/or heaters are closely-spaced to provide an isothermal platform.
  At least one thermistor or other semiconductor device suitable for sensing the absolute temperature as needed for control and monitoring purposes.
  The thermoelectric devices and nanowires are formed from a device layer, wherein the layer is selected from the following non-exclusive list of materials, including comprises a layer of Si, Ge, SiGe, BiTe, graphine, carbon nanotubes.
  The micro-platform comprises a support layer having low thermal conductivity, wherein the support layer is selected from the following non-exclusive list of materials including $SiO_2$, $Si_3N_4$ and $TiO_2$.
  An LED illuminates a semiconductor photodiode within or on the micro-platform.
  The photocurrent of the photodiode is modulated by condensed moisture and monitored externally by a signal conditioning circuit (to determine dew point).
  A micro-platform having one or more patterned semiconductor layers of Si, SiGe, BiTe, graphine, carbon nanotubes and other materials.
  A control and signal conditioning circuit.

Example 3

Flow Sensor

A thermoelectric micro-platform in accordance with the present teachings can be adapted for use as a flow sensor. In some such embodiments, the thermoelectric micro-platform is heated via thermal conduction, convection, or radiation from a nearby heating element. The heating element is typically a micro-heater; in some embodiments the micro-heater is implemented as a thermoelectric micro-platform wherein an external electrical power source is used to heat the platform. The micro-platform is then cooled to a reference null temperature using thermoelectric devices operating as Peltier coolers. Seebeck sensors for temperature sensing.

The Peltier cooling provides a form of negative feedback by cooling the micro-platform to a predetermined reference null. The amount of power required to cool the platform to a reference temperature is a unique power level that indicates the micro-platform temperature. Using such thermal feedback Peltier cooling enables sensing for a reference null temperature, increases the sensor measurement accuracy, and permits a simplified readout that is a highly sensitive 1-bit signal level comparator (instead of a multi-bit analog-to-digital converter).

Figure 12:
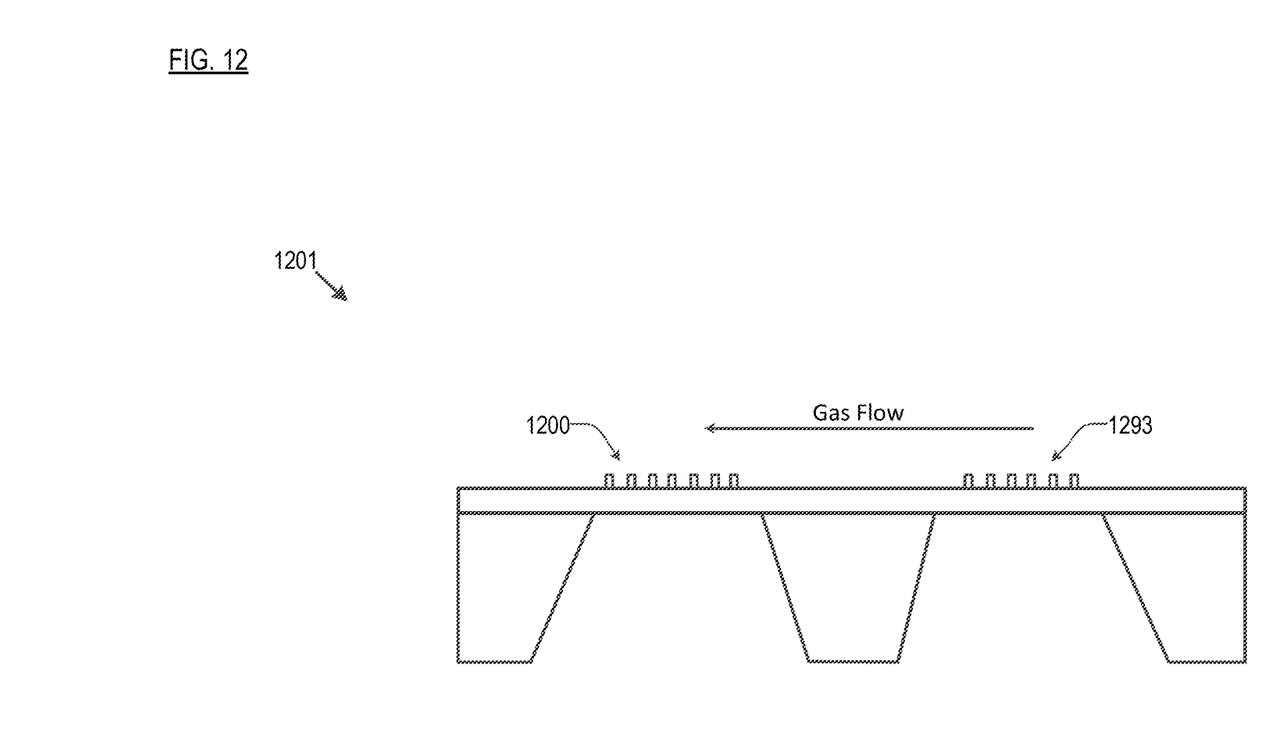
FIG. 12 depicts a simplified side view of a gas flow measurement device incorporating a thermoelectric micro-platform in accordance with the present teachings.

FIG. 12 depicts a cross-section view of a simplified gas flow sensor 1201 in accordance with the present teachings. Flow sensor 1201 comprises only a single thermoelectric micro-platform 1200, although other embodiments may include multiple thermoelectric micro-platforms. Micro-heater 1293, which comprises a resistor driven by an external controlled power source, is disposed nearby thermoelectric micro-platform 1200 in this embodiment. Typical separation between a heater, such as micro-heater 1293, and the thermoelectric micro-platform, such as thermoelectric micro-platform 1200 is typically about the same as an outside dimension (c.a. 1 millimeter or less) of thermoelectric micro-platform 1200.

A gas flowing over micro-heater 1293 is heated by an incremental temperature amount that is proportional to the time it remains over the micro-heater. The gas flow is heated primarily through convection, but heating by conduction and/or radiation means can also be significant in some applications. The gas flow provides a heat-transfer mechanism from the micro-heater 1293 for incrementally heating micro-platform 1200. In this gas flow sensor, the incremental heating of the micro-platform is approximately proportional to the rate of vectored gas flow from the heater to the thermoelectric platform. In this embodiment, the thermoelectric micro-platform is cooled to a null temperature with the Peltier cooler and sensed via the Seebeck thermocouple array. This feedback control circuit permits the use of a single comparator to establish a reference temperature on the thermoelectric micro-platform 1200. The amount of power supplied externally to achieve the reference temperature is approximately proportional to the vectored gas flow rate across the gas flow sensor.

Figure 13:
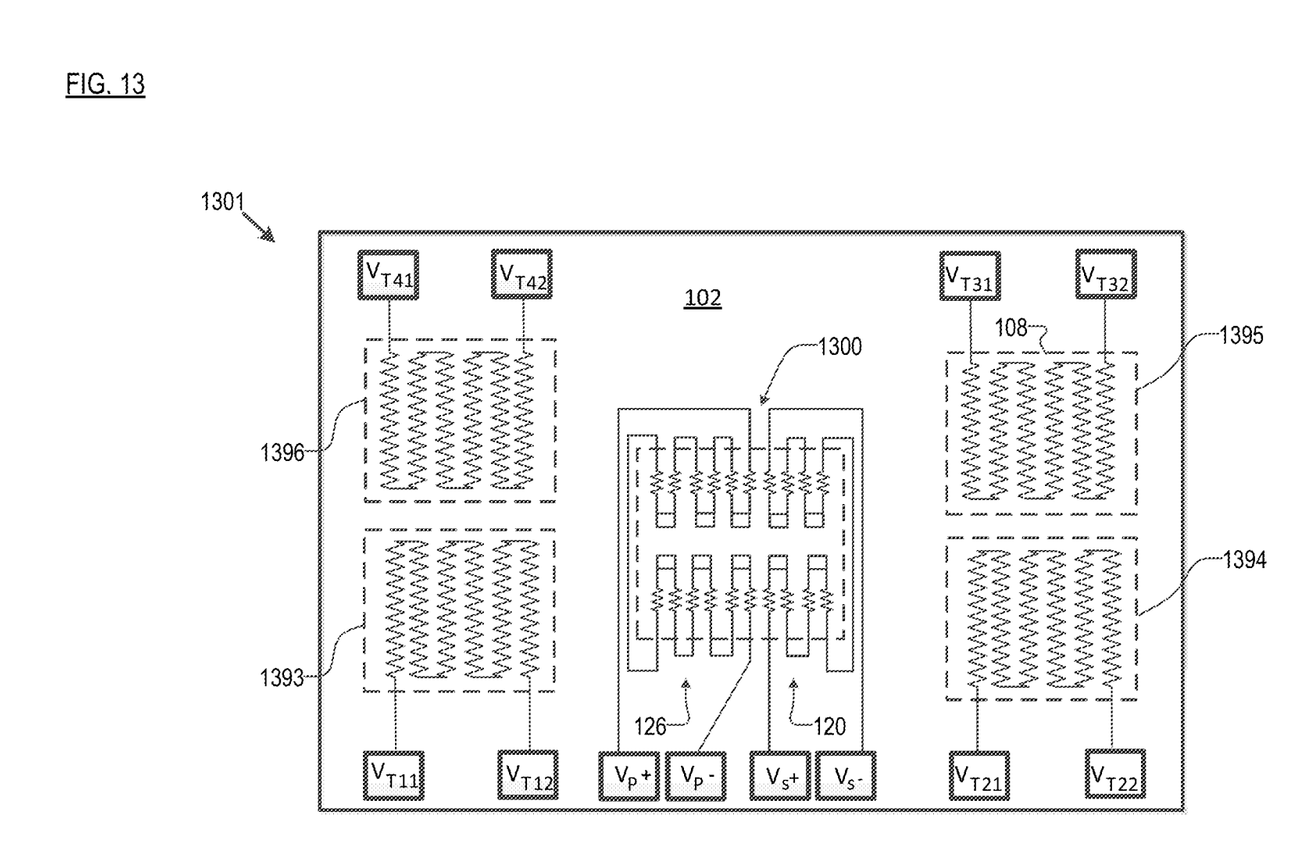
FIG. 13 depicts a plan view of a gas flow measurement device incorporating a thermoelectric micro-platform in accordance with the present teachings.

FIG. 13 depicts a plan view of flow sensor 1301 in accordance with the present teachings. Flow sensor 1301 is based on the same type of architecture as flow sensor 1201, except that flow sensor 1301 incorporates four micro-platform based heaters, which are implemented as heaters 1393, 1394, 1395, and 1396. Like flow sensor 1201, flow sensor 1301 includes one thermoelectric micro-platform 1300. Voltage, sourced from an external voltage supply, is applied to contacts $V_{Tr}$ of the heaters. Thermoelectric micro-platform 1300 comprises array 126 of thermoelectric devices operated as Peltier coolers and array 120 of thermoelectric devices operated as Seebeck sensors.

It is to be understood that although the disclosure teaches many examples of embodiments in accordance with the present teachings, many additional variations of the invention can easily be devised by those skilled in the art after reading this disclosure. As a consequence, the scope of the present invention is to be determined by the following claims.

What is claimed:

1. An apparatus comprising a thermoelectric micro-device, wherein the thermoelectric micro-device comprises:
    a micro-platform, the micro-platform having a support layer that is suspended at a perimeter thereof, and a device layer disposed on a portion of the support layer;
    an off-platform region, the off-platform region surrounding the micro-platform;
    a plurality of thermoelectric devices organized into a first group and a second group, wherein a first junction of each thermoelectric device is disposed in or on the device layer and a second junction of each thermoelectric device is disposed in or on the off-platform region, wherein:
        (i) the first group of thermoelectric devices is operated in a Seebeck thermovoltaic mode wherein a voltage is generated responsive to the temperature of the first junction of each thermoelectric device in the first group, and
        (ii) the second group of thermoelectric devices is operated in a Peltier cooling mode wherein the first junction of each thermoelectric device in the second group cools responsive to the application of a voltage to the second group of thermoelectric devices;
    a first plurality of nanowires, wherein the first plurality of nanowires electrically couple the first junctions to respective second junctions.

2. The apparatus of claim 1 wherein the nanowires have a physical adaptation that enhances scattering of phonons.

3. The apparatus of claim 2 wherein the physical adaption comprises a plurality of holes in the nanowires.

4. The apparatus of claim 1 wherein a cross sectional dimension of each of the nanowires is less than 100 nanometers.

5. The apparatus of claim 1 wherein the nanowires comprise semiconductor.

6. The apparatus of claim 1 wherein the nanowires are comprise nanotubes that are electrically conductive.

7. The apparatus of claim 1 further comprising an enclosure providing a gas-tight seal.

8. The apparatus of claim 7 wherein a gas selected from the group consisting of xenon and argon is contained within the enclosure.

9. The apparatus of claim 1 further comprising an enclosure, wherein the enclosure is vented to an ambient environment.

10. The apparatus of claim 1 further comprising an integrated circuit, wherein the integrated circuit is disposed in or on the device layer of the microplatform.

11. The apparatus of claim 10 and further comprising a second plurality of nanowires, wherein the second plurality of nanowires electrically connect the integrated circuit to electrical contacts disposed on the off-platform region.

12. The apparatus of claim 1 wherein the apparatus is a hygrometer, and wherein the apparatus further comprises:
    a photo source, wherein the photo source is disposed beneath the support layer;
    an optical sensor, wherein the optical sensor is disposed in or on the device layer;
    an enclosure for enclosing the hygrometer, the enclosure defining a hygrometer chamber; and
    an air filter, wherein the air filter removes particulates from ambient air entering the hygrometer chamber but permits moisture to pass into the hygrometer chamber.

13. The apparatus of claim 12 wherein the photo source is positioned and oriented so that light emitted therefrom passes through the support layer and directly into the device layer.

14. The apparatus of claim 12 wherein the photo source is positioned and oriented so that light emitted therefrom passes through the support layer and impinges on a surface from which the light is reflected to an upper surface of the device layer.

15. The apparatus of claim 12 wherein the photo source is an LED that emits light in the near-infrared range.

16. The apparatus of claim 12 wherein the optical sensor is a p-n photodiode.

17. The apparatus of claim 16 wherein the p-n photodiode is disposed in or on the device layer.

18. The apparatus of claim 1 wherein the apparatus is a gas flow sensor, wherein the apparatus further comprises a plurality of micro-heaters, wherein each micro-heater comprises a resistor disposed on a device layer of a micro-platform disposed in the off-platform region.

19. The apparatus of 18 wherein the resistor of each micro-heater is electrically connected to a controlled voltage supply.

20. The apparatus of claim 18 wherein each of the micro-heaters is within about 1 millimeter or less from the thermoelectric micro-platform.

* * * * *